United States Patent
Rao

(10) Patent No.: US 7,928,425 B2
(45) Date of Patent: Apr. 19, 2011

(54) SEMICONDUCTOR DEVICE INCLUDING A METAL-TO-SEMICONDUCTOR SUPERLATTICE INTERFACE LAYER AND RELATED METHODS

(75) Inventor: Kalipatnam Vivek Rao, Grafton, MA (US)

(73) Assignee: Mears Technologies, Inc., Waltham, MA (US)

( * ) Notice: Subject to any disclaimer, the term of this patent is extended or adjusted under 35 U.S.C. 154(b) by 543 days.

(21) Appl. No.: 12/018,255

(22) Filed: Jan. 23, 2008

(65) Prior Publication Data
US 2008/0179588 A1    Jul. 31, 2008

Related U.S. Application Data

(60) Provisional application No. 60/886,528, filed on Jan. 25, 2007.

(51) Int. Cl.
H01L 29/06 (2006.01)
(52) U.S. Cl. .................. 257/20; 438/570; 257/E29.271; 257/E21.085
(58) Field of Classification Search .............. 257/20, 257/E29.271, E29.311, E21.085; 438/570
See application file for complete search history.

(56) References Cited

U.S. PATENT DOCUMENTS

| | | | |
|---|---|---|---|
| 4,485,128 A | 11/1984 | Dalal et al. | 427/85 |
| 4,594,603 A | 6/1986 | Holonyak, Jr. | 357/16 |
| 4,882,609 A | 11/1989 | Schubert et al. | 357/22 |
| 4,908,678 A | 3/1990 | Yamazaki | 357/4 |
| 4,937,204 A | 6/1990 | Ishibashi et al. | 437/110 |
| 4,969,031 A | 11/1990 | Kobayashi et al. | 357/63 |
| 5,055,887 A | 10/1991 | Yamazaki | 357/4 |
| 5,081,513 A | 1/1992 | Jackson et al. | 357/23.7 |
| 5,216,262 A | 6/1993 | Tsu | 257/17 |
| 5,357,119 A | 10/1994 | Wang et al. | 257/18 |
| 5,576,221 A | 11/1996 | Takemura et al. | 437/2 |
| 5,577,061 A | 11/1996 | Hasenberg et al. | 372/45 |
| 5,594,567 A | 1/1997 | Akiyama et al. | 349/28 |
| 5,606,177 A | 2/1997 | Wallace et al. | 257/25 |
| 5,616,515 A | 4/1997 | Okuno | 438/478 |

(Continued)

FOREIGN PATENT DOCUMENTS

EP    0 843 361    5/1998

(Continued)

OTHER PUBLICATIONS

Fan et al., *N- and P-Type SiGe/Si Superlattice Coolers*, the Seventeenth Intersociety Conference on Thermomechanical Phenomena in Electronic Systems (ITherm 2000), vol. 1, pp. 304-307, Las Vegas, NV, May 2000.

(Continued)

*Primary Examiner* — Benjamin P Sandvik
*Assistant Examiner* — W. Wendy Kuo
(74) *Attorney, Agent, or Firm* — Allen, Dyer, Doppelt, Milbrath & Gilchrist, P.A.

(57) ABSTRACT

A semiconductor device which may include a semiconductor layer, and a superlattice interface layer therebetween. The superlattice interface layer may include a plurality of stacked groups of layers. Each group of layers may include a plurality of stacked base semiconductor monolayers defining a base semiconductor portion, and at least one non-semiconductor monolayer constrained within a crystal lattice of adjacent base semiconductor portions. At least some atoms from opposing base semiconductor portions may be chemically bound together with the chemical bonds traversing the at least one intervening non-semiconductor monolayer.

27 Claims, 9 Drawing Sheets

U.S. PATENT DOCUMENTS

| | | | |
|---|---|---|---|
| 5,627,386 A | 5/1997 | Harvey et al. | 257/79 |
| 5,683,934 A | 11/1997 | Candelaria | 437/134 |
| 5,684,817 A | 11/1997 | Houdre et al. | 372/45 |
| 5,994,164 A | 11/1999 | Fonash et al. | 438/97 |
| 6,058,127 A | 5/2000 | Joannopoulos et al. | 372/92 |
| 6,255,150 B1 | 7/2001 | Wilk et al. | 438/191 |
| 6,274,007 B1 | 8/2001 | Smirnov et al. | 204/192 |
| 6,281,518 B1 | 8/2001 | Sato | 257/13 |
| 6,281,532 B1 | 8/2001 | Doyle et al. | 257/288 |
| 6,326,311 B1 | 12/2001 | Ueda et al. | 438/694 |
| 6,344,271 B1 | 2/2002 | Yadav et al. | 428/402 |
| 6,350,993 B1 | 2/2002 | Chu et al. | 257/19 |
| 6,376,337 B1 | 4/2002 | Wang et al. | 438/478 |
| 6,436,784 B1 | 8/2002 | Allam | 438/380 |
| 6,472,685 B2 | 10/2002 | Takagi | 257/77 |
| 6,498,359 B2 | 12/2002 | Schmidt et al. | 257/190 |
| 6,501,092 B1 | 12/2002 | Nikonov et al. | 257/29 |
| 6,521,519 B2 | 2/2003 | Kamath et al. | 438/786 |
| 6,566,679 B2 | 5/2003 | Nikonov et al. | 257/29 |
| 6,608,327 B1 | 8/2003 | Davis et al. | 257/76 |
| 6,621,097 B2 | 9/2003 | Nikonov et al. | 257/17 |
| 6,638,838 B1 | 10/2003 | Eisenbeiser et al. | 438/481 |
| 6,646,293 B2 | 11/2003 | Emrick et al. | 257/194 |
| 6,673,646 B2 | 1/2004 | Droopad | 438/85 |
| 6,690,699 B2 | 2/2004 | Capasso et al. | 372/44 |
| 6,711,191 B1 | 3/2004 | Kozaki et al. | 372/43 |
| 6,748,002 B2 | 6/2004 | Shveykin | 372/45 |
| 6,816,530 B2 | 11/2004 | Capasso et al. | 372/50 |
| 6,897,472 B2 * | 5/2005 | Mears et al. | 257/28 |
| 7,023,010 B2 | 4/2006 | Wang et al. | 257/15 |
| 7,238,567 B2 | 7/2007 | Xiong | 438/240 |
| 7,586,116 B2 * | 9/2009 | Kreps et al. | 257/28 |
| 2002/0094003 A1 | 7/2002 | Bour et al. | 372/46 |
| 2003/0034529 A1 | 2/2003 | Fitzgerald et al. | 257/369 |
| 2003/0057416 A1 | 3/2003 | Currie et al. | 257/19 |
| 2003/0089899 A1 | 5/2003 | Lieber et al. | 257/9 |
| 2003/0162335 A1 | 8/2003 | Yuki et al. | 438/151 |
| 2003/0206691 A1 | 11/2003 | Puzey | 385/24 |
| 2003/0215990 A1 | 11/2003 | Fitzgerald et al. | 438/172 |
| 2004/0084781 A1 | 5/2004 | Ahn et al. | 257/777 |
| 2004/0227165 A1 | 11/2004 | Wang et al. | 257/222 |
| 2005/0101134 A1* | 5/2005 | Brask et al. | 438/689 |
| 2006/0267130 A1 | 11/2006 | Rao | 257/499 |
| 2007/0010040 A1 | 1/2007 | Mears et al. | 438/48 |
| 2008/0145984 A1* | 6/2008 | Ke et al. | 438/197 |

FOREIGN PATENT DOCUMENTS

| | | |
|---|---|---|
| GB | 2347520 | 9/2000 |
| JP | 61027681 | 2/1986 |
| JP | 61220339 | 9/1986 |
| JP | 62219665 | 9/1987 |
| WO | 99/63580 | 12/1999 |
| WO | 02/103767 | 12/2002 |
| WO | WO2005004241 | 1/2005 |

OTHER PUBLICATIONS

Tsu, *Phenomena in Silicon Nanostructure Devices*, University of North Carolina at Charlotte, Sep. 6, 2000.

Ye et al., *GaAs MOSFET with Oxide Gate Dielectric Grown by Atomic Layer Deposition*, Agere Systems, Mar. 2003.

Novikov et al., *Silicon-based Optoelectronics*, 1999-2003, pp. 1-6.

Fan et al., *N- and P-Type SiGe/Si Superlattice Coolers*, the Seventeenth Intersociety Conference on Thermomechanical Phenomena in Electronic Systems (ITherm 2000), vol. 1, pp. 304-307, Las Vegas, NV, May 2000.

Shah et al., *Experimental Analysis and Theoretical Model for Anomalously High Ideality Factors ($n>2.0$) in AlGaN/GaN P-N Junction Diodes*, Journal of Applied Physics, vol. 94, No. 4, Aug. 15, 2003.

Ball, *Striped Nanowires Shrink Electronics*, news@nature.com, Feb. 7, 2002.

Fiory et al., *Light Emission from Silicon: Some Perspectives and Applications*, Journal of Electronic Materials, vol. 32, No. 10, 2003.

*Lecture 6: Light Emitting and Detecting Devices*, MSE 6001, Semiconductor Materials Lectures, Fall 2004.

*Harvard University Professor and Nanosys Co-Founder, Charlie Lieber, Raises the Stakes in the Development of Nanoscale Superlattice Structures and Nanodevices*, Feb. 8, 2002, Nanosys, Inc.

Grupp et al., *A New Junction for Low-Resistance Contacts and Schottky Barrier MOSFETS*, IEEE 2005 International Workshop on Junction Technology.

Connelly et al., *A New Route to Zero-Barrier Metal Source/Drain MOSFETs*, IEEE Transactions on Nanotechnology, vol. 3, No. 1, Mar. 2004.

Tsu et al., "Structure of MBE Grown Semiconductor-Atomic Superlattices", Journal of Crystal Growth, Elseiver, Amsterdam, NL, vol. 227-228, Jul. 1, 2001, pp. 21-26, XP004250792, ISSN: 0022-0248.

\* cited by examiner

SEMICONDUCTOR DEVICE INCLUDING A METAL-TO-SEMICONDUCTOR SUPERLATTICE INTERFACE LAYER AND RELATED METHODS

RELATED APPLICATION

This application is based upon prior filed copending provisional application Ser. No. 60/886,528 filed Jan. 25, 2007, the entire subject matter of which is incorporated herein by reference in its entirety.

FIELD OF THE INVENTION

The present invention relates to the field of semiconductors, and, more particularly, to semiconductor devices comprising superlattices and associated methods.

BACKGROUND OF THE INVENTION

As discussed in an article to Grupp et al. entitled "A New Junction Technology for Low-Resistance Contacts and Schottky Barrier MOSFETs" from the 2005 International Workshop on Junction Technology, the authors discuss the increasing severity of the challenges for engineering the source and drain (S/D) regions of advanced CMOS devices:
 "The drive to shallower junctions requires extreme technology to control the dopant depth and profile, while simultaneously limiting the resistance to acceptable values. One approach to managing short-channel integrity is ultra-thin-body fully-depleted SOI technology. However, doped S/D's in ultra-thin Si suffer from excessive sheet resistance, resulting in high resistance from the channel to the silicide contact, and high contact resistance to the silicide. One approach to improving sheet resistance is elevated S/D technology. However, this adds a penalty in gate-to-drain and gate-to-source capacitance, and the issue of doping control remains. The obvious solution is metal, or "Schottky" S/D. Yet Schottky S/D MOSFETs, especially n-channel MOSFETs, have to date been generally limited by excessive Schottky barriers between the S/D and the channel."
Grupp et al., page 1.

To address these challenges, Grupp et al. propose an ultra-thin insulator (i.e., $SiN_x$) between the metal and the semiconductor, which purportedly lowers the Schottky barrier and reduces the S/D resistance by a factor of 5000 in Mg contacts to moderately-doped n-type Si. The authors state that the result is a low-resistance contact that may be used for contacts to doped S/D regions, as well as to replace doped S/D regions with a metal for advanced/high-performance Schottky barrier MOSFETs.

Despite the advancements in contact technology such as disclosed in Grupp et al., further improvements in metal-to-semiconductor contacts or layers may be desirable in various applications.

SUMMARY OF THE INVENTION

In view of the foregoing background, it is therefore an object of the present invention to provide a semiconductor device with enhanced metal-to-semiconductor interfaces.

This and other objects, features, and advantages are provided by a semiconductor device which may include a semiconductor layer, a metal layer, and a superlattice interface layer between the semiconductor layer and the metal layer. More particularly, the superlattice interface layer may include a plurality of stacked groups of layers. Each group of layers may include a plurality of stacked base semiconductor monolayers defining a base semiconductor portion and at least one non-semiconductor monolayer constrained within a crystal lattice of adjacent base semiconductor portions. Moreover, at least some atoms from opposing base semiconductor portions may be chemically bound together with the chemical bonds traversing the at least one intervening non-semiconductor monolayer. The superlattice interface layer may therefore advantageously provide reduced resistance between the semiconductor layer and metal layer, for example.

More particularly, the semiconductor layer may have spaced-apart source and drain regions therein defining a channel region therebetween. As such, the metal layer may include a source metal contact for the source region and a drain metal contact for the drain region. In addition, a gate electrode layer may overlie the channel region. Further, a gate dielectric layer may overlie the channel region and be beneath the gate electrode layer. In some embodiments, the superlattice interface layer may extend beneath the gate electrode layer. Respective superlattice interface layer portions may also be used for each of the source and drain regions.

By way of example, the metal layer may include a plurality of stacked metal layers. The metal layer may also include at least one of copper, aluminum, and ytterbium, for example. Also by way of example, the superlattice interface layer may have a thickness in a range of 3 to 10 Angstroms. The semiconductor layer may be a semiconductor-on-insulator (SOI) substrate, for example.

The base semiconductor may include silicon, and the at least one non-semiconductor monolayer may be selected from the group consisting of oxygen, nitrogen, fluorine, and carbon-oxygen. In some embodiments, at least one group of layers of the superlattice interface layer may be substantially undoped. Also, at least one group of layers of the superlattice interface layer may be doped.

A related method for making a semiconductor device may include forming a superlattice interface layer, such as the one described briefly above, on a semiconductor layer. The method may further include forming a metal layer on the superlattice interface layer.

DETAILED DESCRIPTION OF THE PREFERRED EMBODIMENTS

Figure 1:
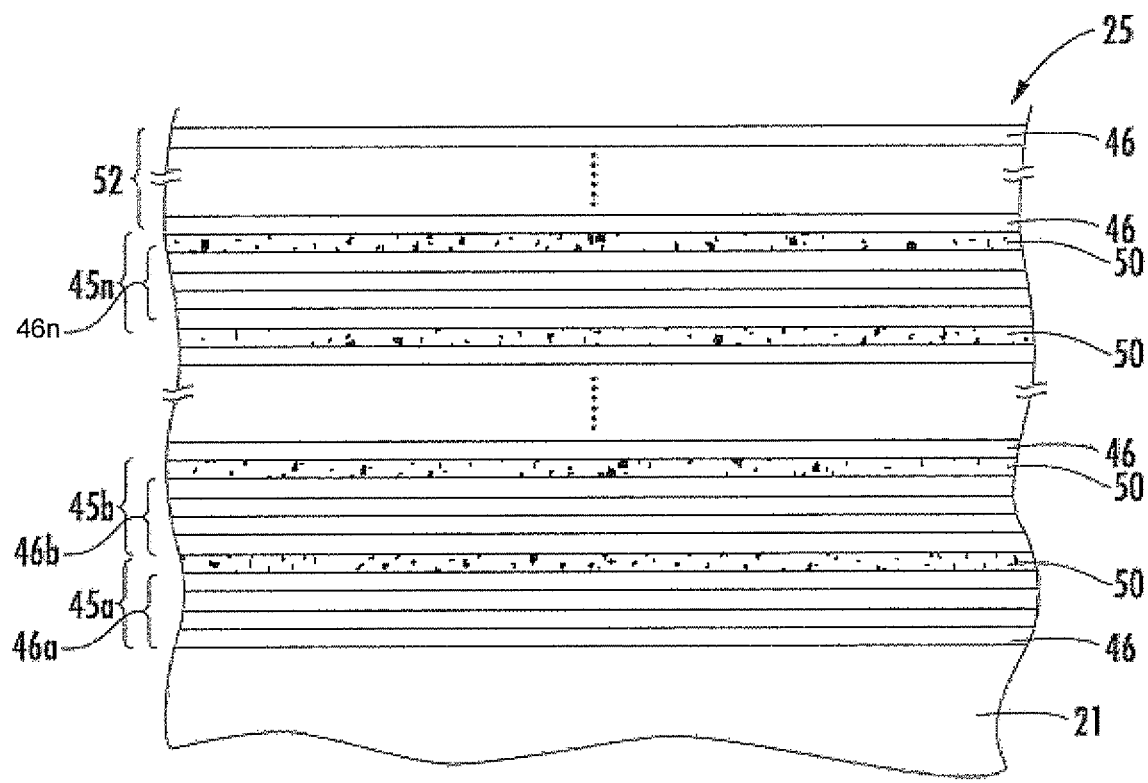
FIG. 1 is a greatly enlarged schematic cross-sectional view of a superlattice for use in a semiconductor device in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in different embodiments.

The present invention relates to controlling the properties of semiconductor materials at the atomic or molecular level. Further, the invention relates to the identification, creation, and use of improved materials for use in semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} f(E(k,n), E_F, T) d^3k}$$

for electrons and:

$$M_{h,ij}^{-1}(E_F, T) = \\ -\frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicants have identified improved materials or structures for use in semiconductor devices. More specifically, the Applicants have identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
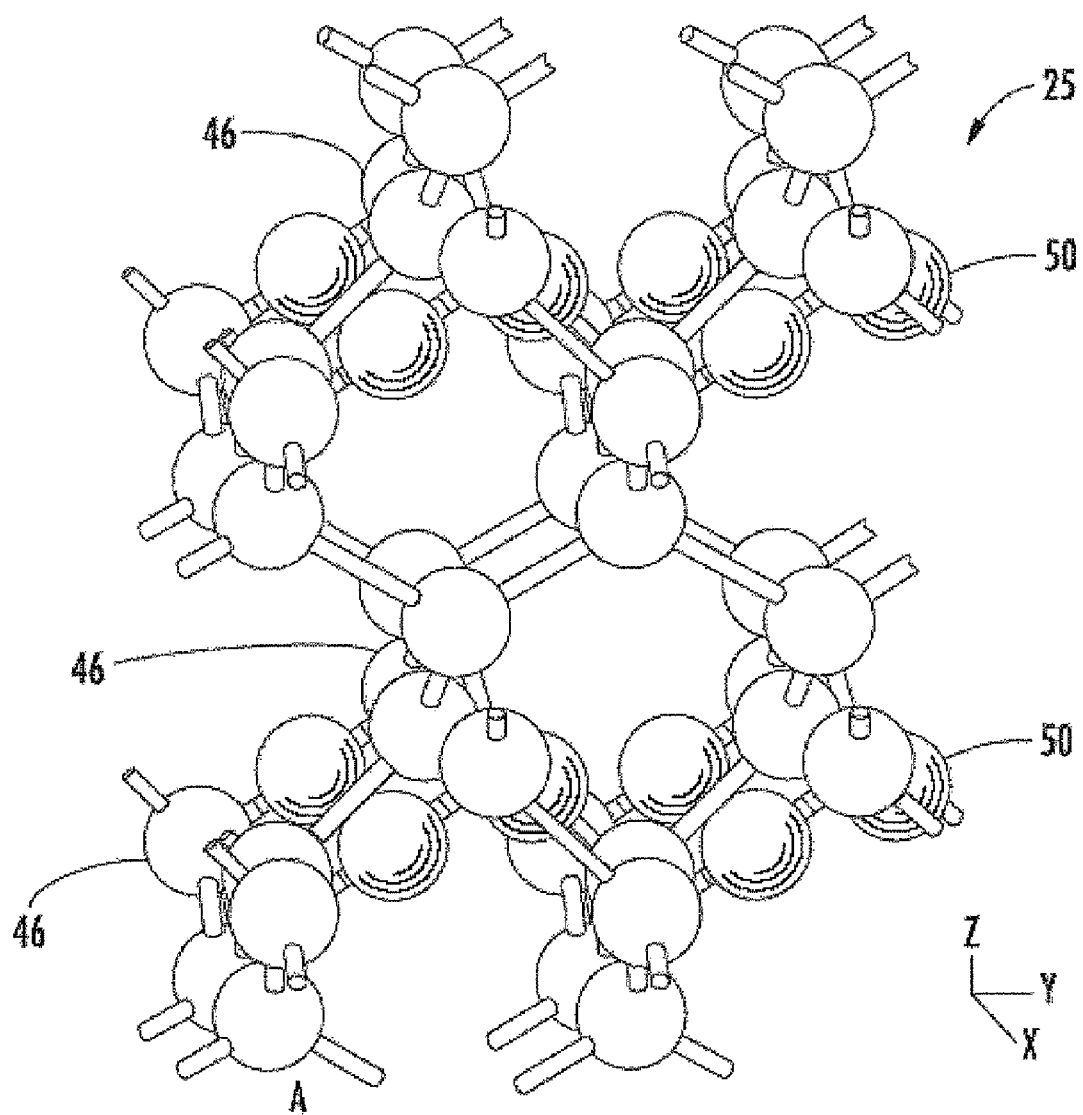
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, with the chemical bonds traversing the intervening non-semiconductor monolayer, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art. This also advantageously allows one or more groups of layers 45a-45n to be doped, while one or more other groups of layers may remain substantially undoped.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons or holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
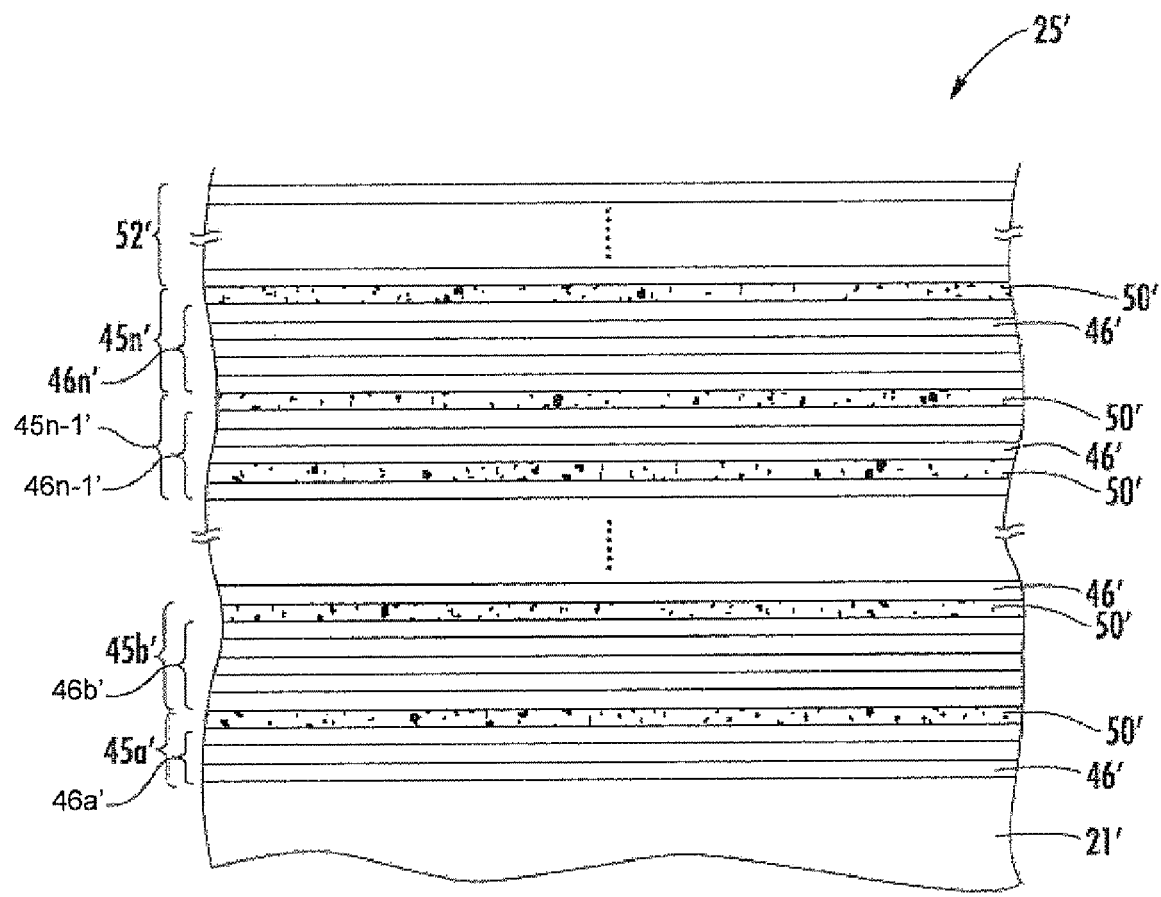
FIG. 3 is a greatly enlarged schematic cross-sectional view of another embodiment of a superlattice in accordance with the invention.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
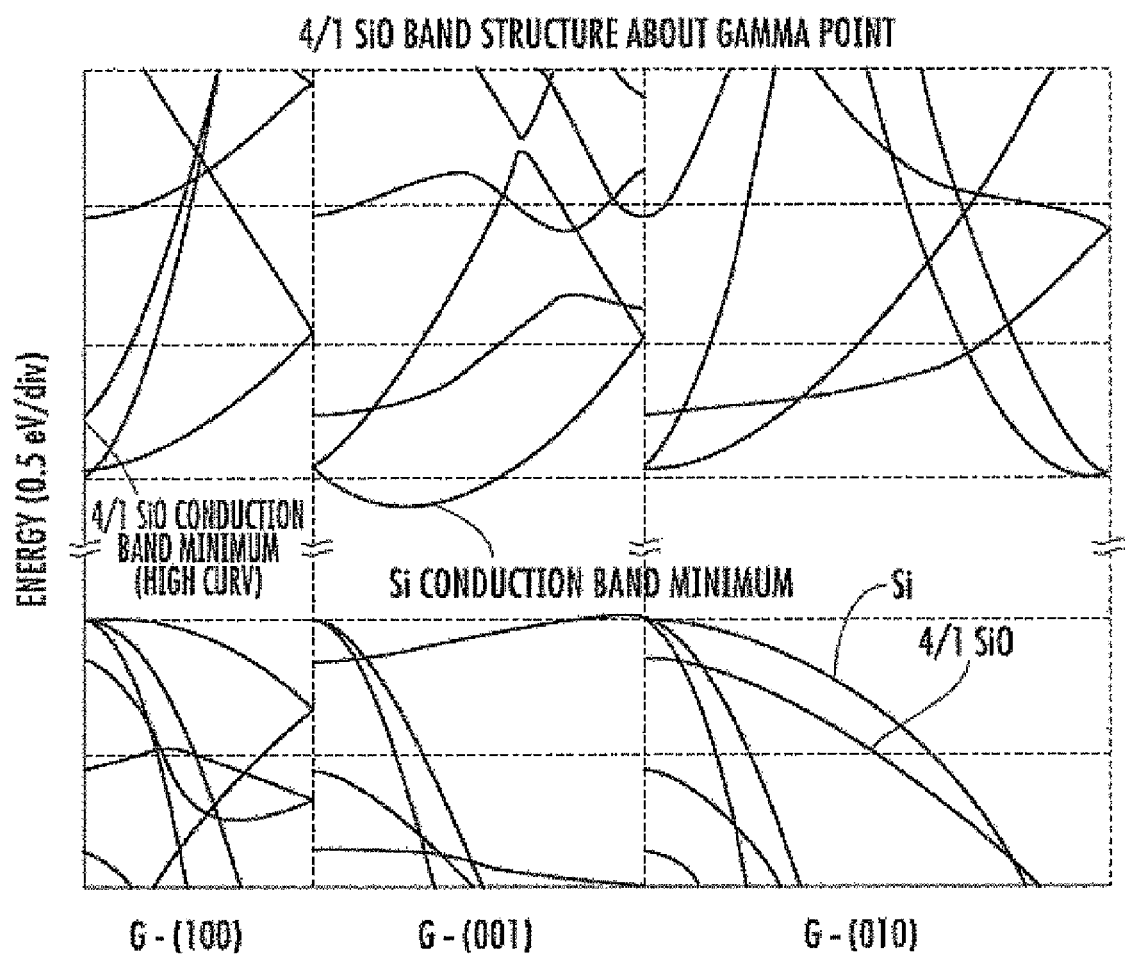
FIG. 4A is a graph of the calculated band structure from the gamma point (G) for both bulk silicon as in the prior art, and for the 4/1 Si/O superlattice as shown in FIGS. 1-2.
Figure 4B:
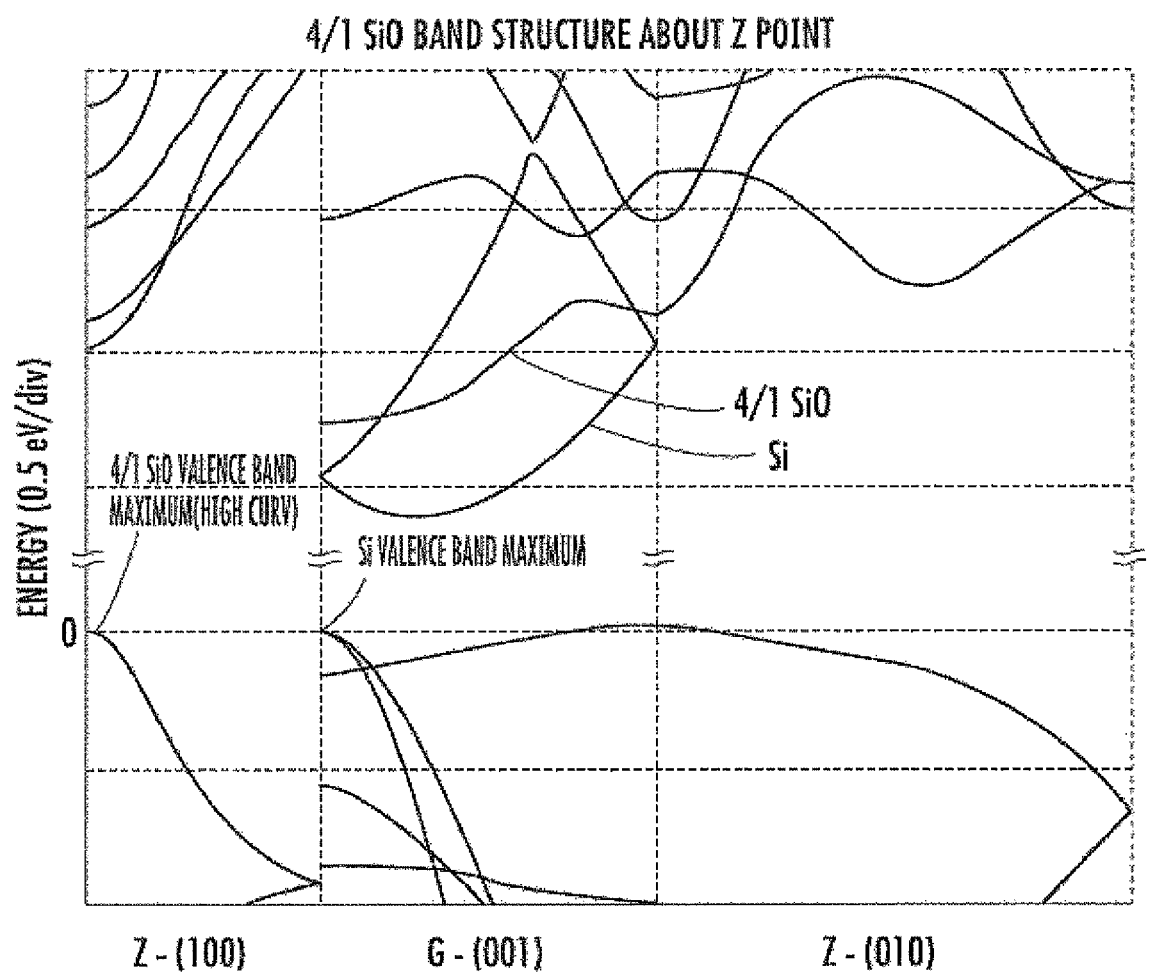
FIG. 4B is a graph of the calculated band structure from the Z point for both bulk silicon as in the prior art, and for the 4/1 Si/O superlattice as shown in FIGS. 1-2.
Figure 4C:
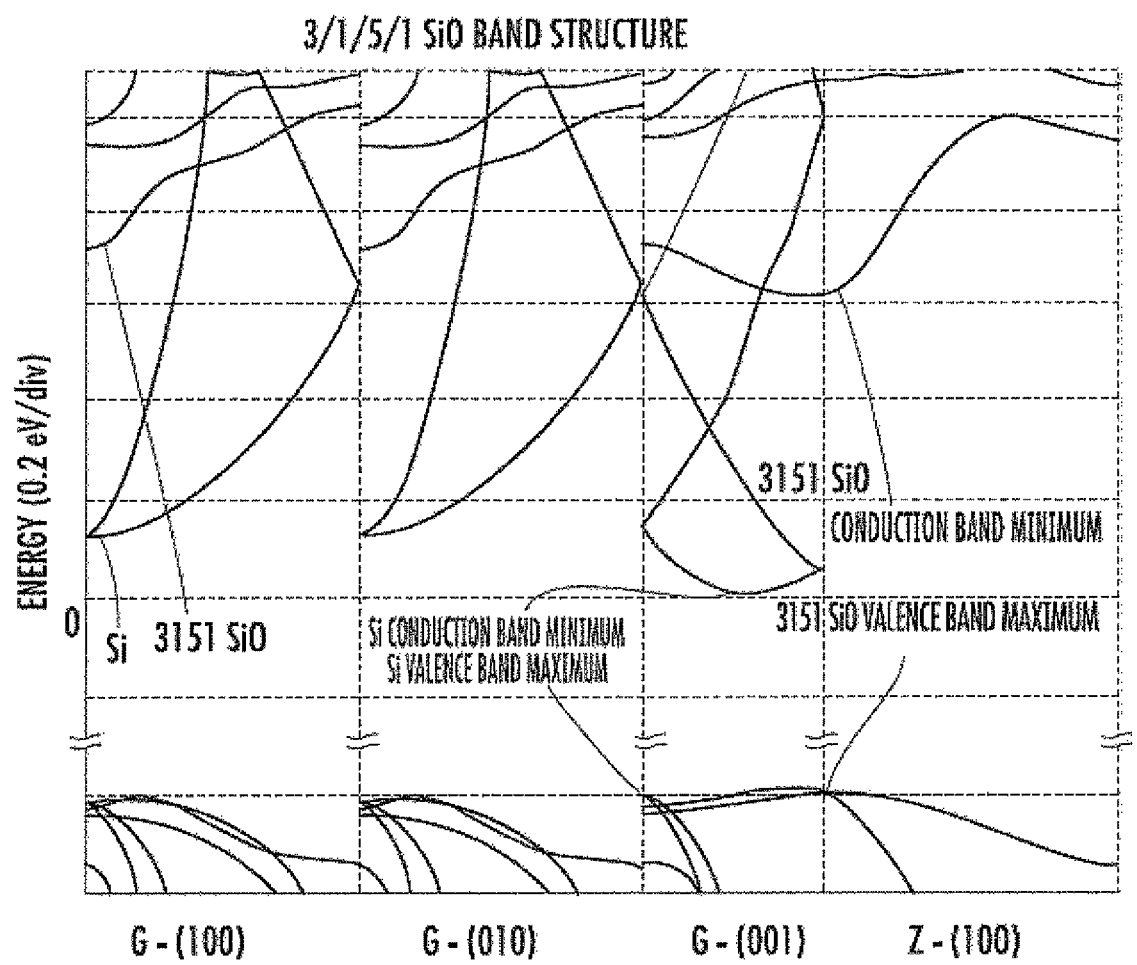
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (OFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
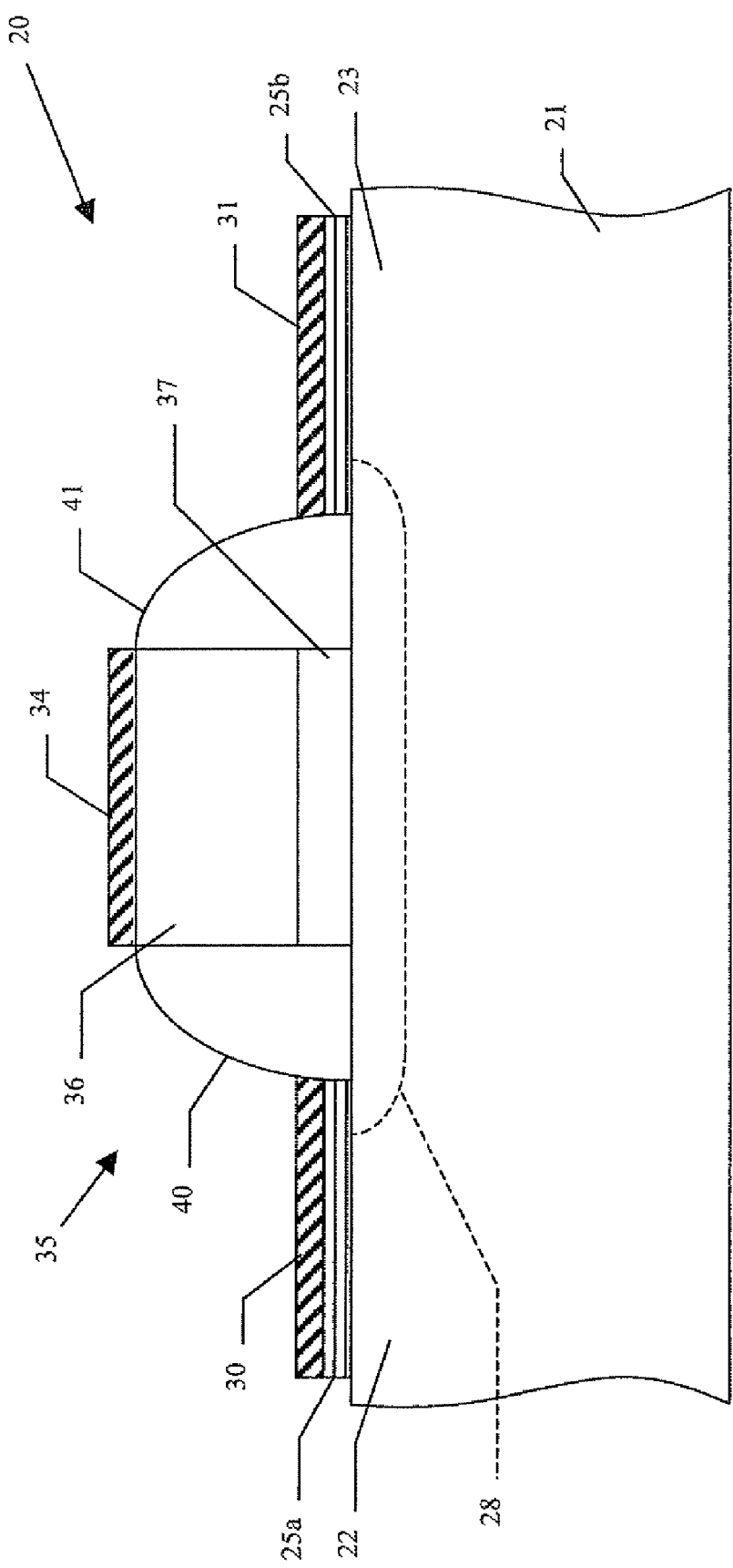
FIG. 5 is a schematic cross-sectional diagram of a MOSFET including superlattice interface layers between the source/drain regions and source/drain metal contacts in accordance with the present invention.

Using the above-described measures, one can select materials having improved band structures for specific purposes. One such example would be a superlattice 25 material as a metal-to-semiconductor interface layer in a semiconductor device. A planar MOSFET 20 including the superlattice 25 is now first described with reference to FIG. 5. One skilled in the art, however, will appreciate that the materials identified herein could be used in many different types of semiconductor devices, such as discrete devices and/or integrated circuits.

The illustrated MOSFET 20 includes a semiconductor layer 21 (e.g., silicon, germanium, silicon-germanium, strained silicon, etc.) and source/drain regions 22, 23 in the semiconductor layer defining a channel region 28 therebetween. The semiconductor layer 21 could be a semiconductor substrate, or a substrate with an optical layer thereon, for example. Relatively thin respective source/drain metal interface superlattice layer portions 25a, 25b overlie the source/drain regions 22, 23 on the substrate 21. By way of example, the superlattice interface layer portions 25a, 25b may have a thickness in a range of about 3 to 10 Angstroms, although other thicknesses may also be used.

Furthermore, source/drain metal contact layers 30, 31 overlie the superlattice layer portions 25a, 25b, respectively. The contacts 30, 31 may comprise various metals known to those skilled in the art for providing electrical connections in semiconductor devices, such as aluminum, copper, etc., as well as alloys. A gate 35 illustratively includes a gate dielectric layer 37 overlying the channel region 28, and a gate electrode layer 36 on the gate dielectric layer. Sidewall spacers 40, 41 are also provided in the illustrated MOSFET 20, as well as a contact layer 34 on the gate electrode layer 36.

By including the relatively thin superlattice interface layer portions 25a, 25b on the substrate 21 between the source/drain regions 22, 23 and the source/drain contacts 30, 31, respectively, the contacts are in very close proximity to the semiconductor layer 21, which advantageously reduces source/drain resistance with respect to conventional MOSFET devices, as will be appreciated by those skilled in the art. As such, Applicants also theorize without wishing to be bound thereto that a reduced amount of dopant (or substantially no dopant) may advantageously be used in the source drain regions 22, 23 in some embodiments.

It should be noted that a metal-to-semiconductor superlattice interface as described above need not be limited to source/drain applications, but could more generally be implemented in other applications where a metal-to-semiconductor contact is required, as will also be appreciated by those skilled in the art. Moreover, such a superlattice interface layer may also be used as an interface between a semiconductor and other metal layers or regions, such as metal source/drain regions, for example.

Figure 6:
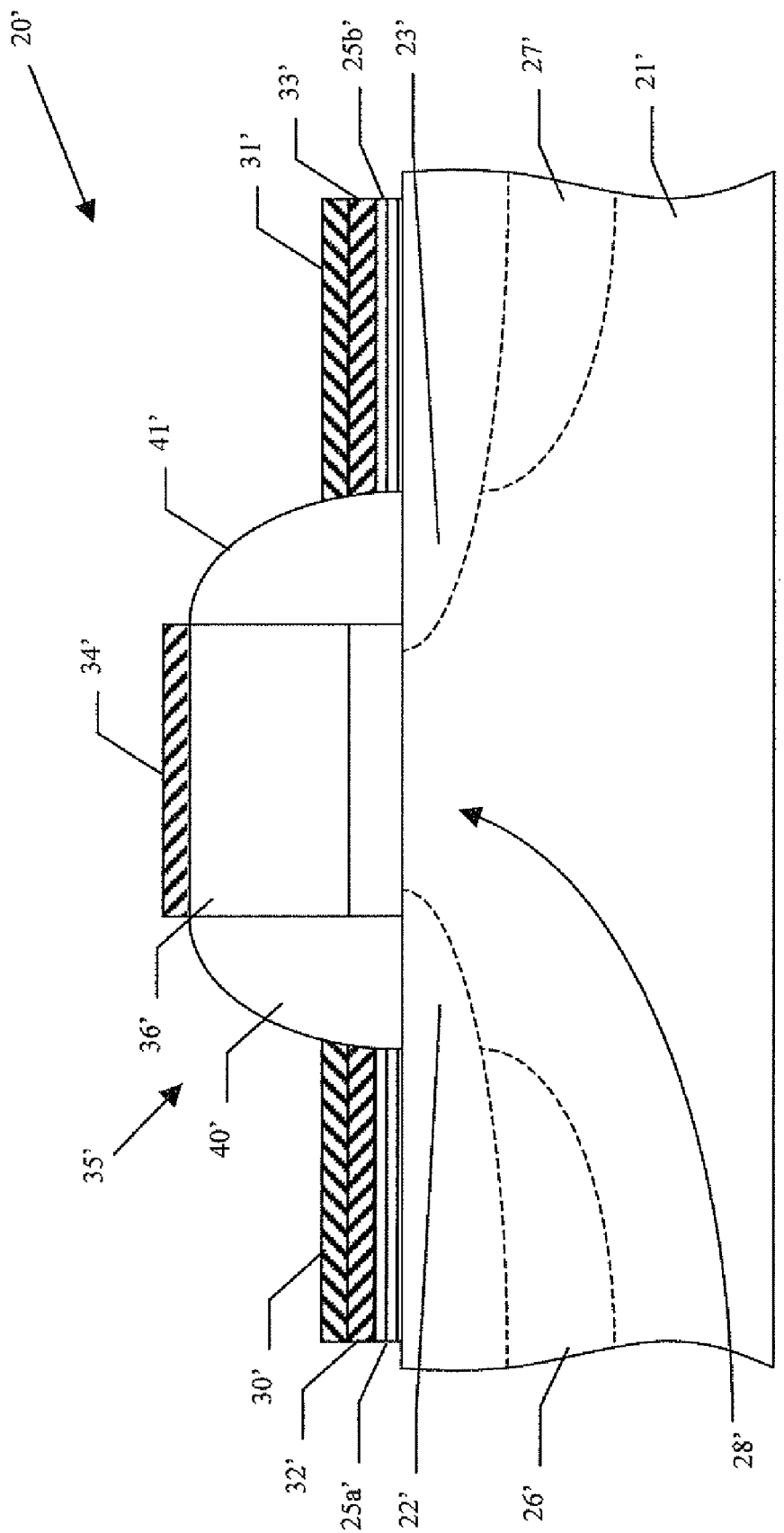
FIG. 6 is a schematic cross-sectional diagram of an alternative embodiment of the MOSFET of FIG. 5.

Turning additionally to FIG. 6, an alternative embodiment of the MOSFET 20' illustratively includes respective additional metal layers 32', 33' between the superlattice layers 25a', 25b' and the metal layers 30', 31'. In particular, the additional metal layers 32', 33' may provide an enhanced interface between the metal contacts 30', 31' and the superlattice layers 25a', 25b'. By way of example, the additional metal layers 32', 33' may include ytterbium (Yb), although other metal combinations may also be used. The present embodiment also illustratively includes lightly doped source/drain extension regions 22', 23', as well as more heavily doped source/drain regions 26', 27'.

Figure 7:
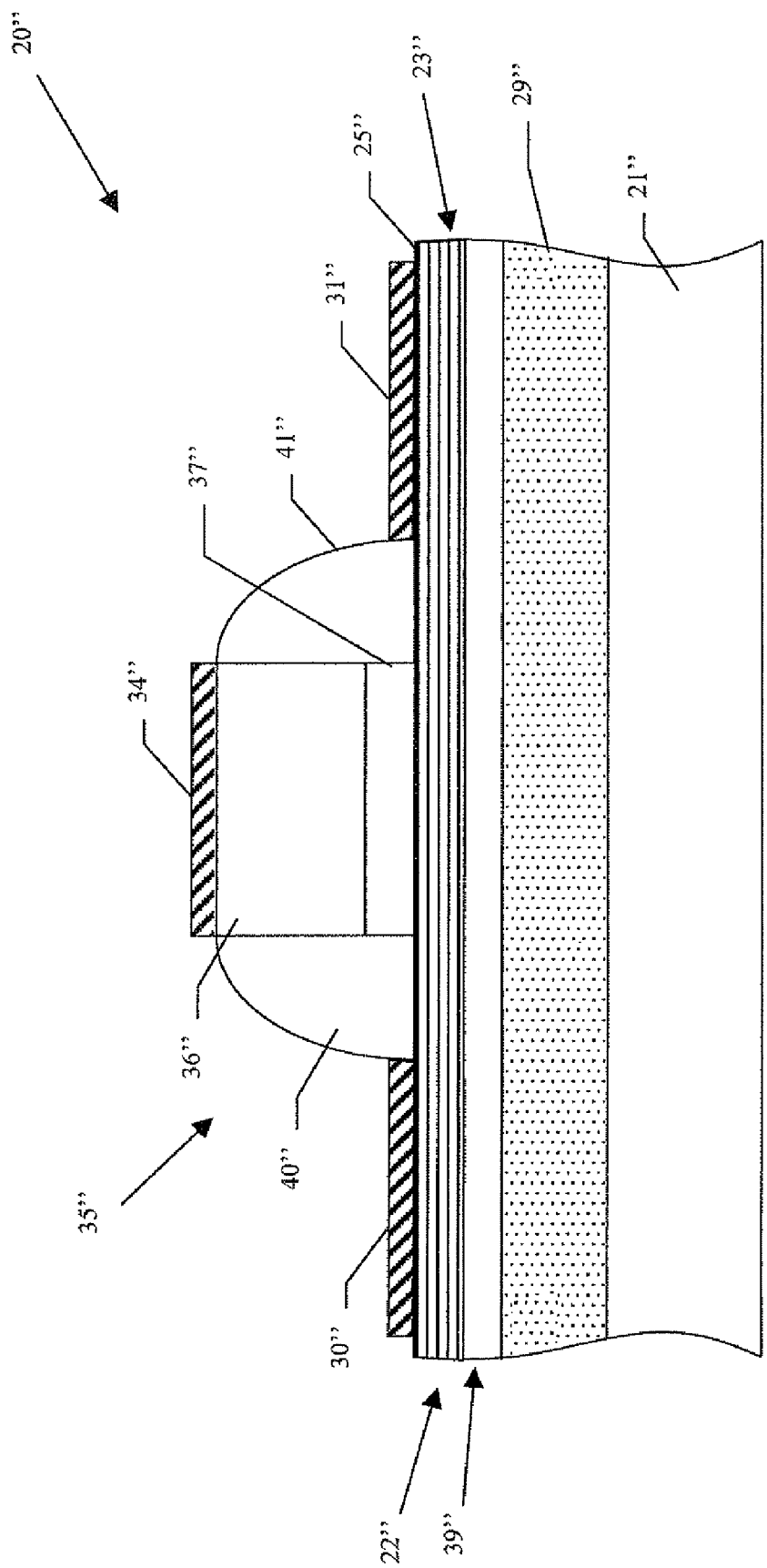
FIG. 7 is a schematic cross-sectional diagram of an alternative SOI embodiment of the MOSFET of FIG. 5.

Referring now additionally to FIG. 7, a semiconductor (e.g., silicon, or Germanium or Si—Ge or strained silicon) on insulator (SOI) embodiment of the MOSFET 20" illustratively includes a silicon, or more generally a semiconductor (strained silicon, germanium, or Si—Ge, etc.), semiconductor layer 21", an insulating layer (e.g., silicon oxide) 29" on the semiconductor layer, and a semiconductor (e.g., silicon) layer 39" on a face of the insulating layer opposite the semiconductor layer. In the illustrated embodiment, the superlattice layer 25" not only provides an interface between the source/drain regions 22", 23" and the metal layers 30", 31", but it may also provide all or a portion of the channel region of the MOSFET. Further details on implementing the above-described superlattice materials in an SOI configuration are set forth in co-pending U.S. application Ser. Nos. 11/381,835 and 11/428,015, which are assigned to the present Assignee and are both hereby incorporated herein in their entireties by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A semiconductor device comprising:
   a semiconductor layer;
   a superlattice interface layer on said semiconductor layer and coupled directly thereto; and
   a metal layer on said superlattice interface layer and coupled directly thereto;
   said superlattice interface layer comprising a plurality of stacked groups of layers, each group of layers comprising a plurality of stacked base semiconductor monolayers defining a base semiconductor portion and at least one non-semiconductor monolayer constrained within a crystal lattice of adjacent base semiconductor portions, and wherein at least some atoms from opposing base semiconductor portions are chemically bound together with the chemical bonds traversing the at least one intervening non-semiconductor monolayer.

2. The semiconductor device of claim 1 wherein said semiconductor layer has spaced-apart source and drain regions therein defining a channel region therebetween; and wherein said metal layer comprises a respective source metal contact for the source region and a drain metal contact for the drain region.

3. The semiconductor device of claim 2 further comprising a gate electrode layer overlying the channel region.

4. The semiconductor device of claim 3 wherein said superlattice interface layer extends beneath said gate electrode layer.

5. The semiconductor device of claim 3 further comprising a gate dielectric layer overlying the channel region and beneath said gate electrode layer.

6. The semiconductor device of claim 2 wherein said superlattice interface layer comprises a respective superlattice interface layer portion for each of said source and drain regions.

7. The semiconductor device of claim 1 wherein said metal layer comprises a plurality of stacked metal layers.

8. The semiconductor device of claim 1 wherein said metal layer comprises at least one of copper, aluminum, and ytterbium.

9. The semiconductor device of claim 1 wherein said superlattice interface layer has a thickness in a range of 3 to 10 Angstroms.

10. The semiconductor device of claim 1 wherein said semiconductor layer comprises a semiconductor-on-insulator (SOI) substrate.

11. The semiconductor device of claim 1 wherein said base semiconductor comprises silicon.

12. The semiconductor device of claim 1 wherein said at least one non-semiconductor monolayer comprises oxygen.

13. The semiconductor device of claim 1 wherein said at least one non-semiconductor monolayer comprises a non-semiconductor selected from the group consisting of oxygen, nitrogen, fluorine, and carbon-oxygen.

14. The semiconductor device of claim 1 wherein at least one group of layers of said superlattice interface layer is substantially undoped.

15. The semiconductor device of claim 1 wherein at least one group of layers of said superlattice interface layer is doped.

16. A semiconductor device comprising:
    a semiconductor layer having spaced-apart source and drain regions therein defining a channel region therebetween;
    a source metal contact coupled to the source region; and
    a drain metal contact coupled to the drain region;
    at least one superlattice interface layer coupled directly between the source region and said source contact, and coupled directly between the drain region and said drain contact;
    said superlattice interface layer comprising a plurality of stacked groups of layers, each group of layers comprising a plurality of stacked base silicon monolayers defining a base silicon portion and at least one oxygen monolayer constrained within a crystal lattice of adjacent base silicon portions, and wherein at least some silicon atoms from opposing base silicon portions are chemically bound together with the chemical bonds traversing the at least one intervening oxygen monolayer.

17. The semiconductor device of claim 16 further comprising a gate electrode layer overlying the channel region.

18. The semiconductor device of claim 17 wherein said at least one superlattice interface layer extends beneath said gate electrode layer.

19. The semiconductor device of claim 17 further comprising a gate dielectric layer overlying the channel region and beneath said gate electrode layer.

20. The semiconductor device of claim 16 wherein said at least one superlattice interface layer comprises a respective superlattice interface layer portion for each of said source and drain regions.

21. A method for making a semiconductor device comprising:
    forming a superlattice interface layer on a semiconductor layer and coupled directly thereto; and
    forming a metal layer on the superlattice interface layer and coupled directly thereto;
    the superlattice interface layer comprising a plurality of stacked groups of layers, each group of layers comprising a plurality of stacked base semiconductor monolayers defining a base semiconductor portion and at least one non-semiconductor monolayer constrained within a crystal lattice of adjacent base semiconductor portions, and wherein at least some atoms from opposing base semiconductor portions are chemically bound together with the chemical bonds traversing the at least one intervening non-semiconductor monolayer.

22. The method of claim 21 further comprising forming spaced-apart source and drain regions in the semiconductor layer defining a channel region therebetween; and wherein forming the metal layer comprises forming a respective source metal contact for the source region and a drain metal contact for the drain region.

23. The method of claim 22 further comprising forming a gate electrode layer overlying the channel region.

24. The method of claim 23 wherein forming the gate electrode layer comprises forming the gate electrode layer overlying the superlattice interface layer.

25. The method of claim 22 wherein forming the superlattice interface layer comprises forming a respective superlattice interface layer portion for each of the source and drain regions.

26. The method of claim 22 further comprising forming a gate dielectric layer overlying the channel region and beneath the gate electrode layer.

27. The method of claim 21 wherein the base semiconductor comprises silicon, and wherein the at least one non-semiconductor monolayer comprises oxygen.

* * * * *